United States Patent
Liu et al.

(10) Patent No.: US 10,277,838 B2
(45) Date of Patent: Apr. 30, 2019

(54) MONOLITHIC VISIBLE/IR FUSED LOW LIGHT LEVEL IMAGING SENSOR

(71) Applicant: BAE Systems Imaging Solutions Inc., San Jose, CA (US)

(72) Inventors: Xinqiao Liu, Medina, WA (US); Boyd Fowler, Sunnyvale, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 286 days.

(21) Appl. No.: 15/222,786

(22) Filed: Jul. 28, 2016

(65) Prior Publication Data
US 2018/0035061 A1    Feb. 1, 2018

(51) Int. Cl.
| | |
|---|---|
| H04N 5/33 | (2006.01) |
| H04N 5/374 | (2011.01) |
| H04N 5/378 | (2011.01) |
| H01L 27/146 | (2006.01) |
| H01L 31/0232 | (2014.01) |

(52) U.S. Cl.
CPC ......... *H04N 5/332* (2013.01); *H01L 27/1463* (2013.01); *H01L 27/14636* (2013.01); *H01L 27/14645* (2013.01); *H01L 27/14649* (2013.01); *H01L 27/14689* (2013.01); *H01L 31/02322* (2013.01); *H04N 5/374* (2013.01); *H04N 5/378* (2013.01)

(58) Field of Classification Search
CPC ........ H04N 5/332; H04N 5/374; H04N 5/378; H01L 27/14636; H01L 27/1463; H01L 27/14645; H01L 27/14649; H01L 27/14689; H01L 31/02322
See application file for complete search history.

(56) References Cited

U.S. PATENT DOCUMENTS

| | | | | |
|---|---|---|---|---|
| 5,373,182 A | * | 12/1994 | Norton | H01L 27/1446 257/440 |
| 7,629,582 B2 | * | 12/2009 | Hoffman | B65G 59/08 250/338.1 |
| 8,058,615 B2 | * | 11/2011 | McCaffrey | G01J 5/08 250/338.4 |
| 9,136,301 B2 | * | 9/2015 | Chang | G01J 1/029 |
| 2010/0019154 A1 | * | 1/2010 | Rafferty | G01J 3/02 250/340 |
| 2017/0018594 A1 | * | 1/2017 | Cao | H01L 27/14652 |

* cited by examiner

*Primary Examiner* — Christine S. Kim
(74) *Attorney, Agent, or Firm* — Calvin B. Ward; Scott J. Asmus

(57) ABSTRACT

An imaging array and method for fabricating the same are disclosed. The imaging array includes a semiconductor substrate having a plurality of VIS pixel sensors and a plurality of SWIR readout circuits fabricated therein. An insulating layer is deposited on the semiconductor substrate. The insulating array has wells overlying the SWIR pixel sensors. A plurality of SWIR photodiodes are deposited in the wells. Each SWIR photodiode is located in a corresponding one of the wells and is connected by an electrically conducting path with the SWIR readout circuit underlying the SWIR photodiode. An electrically conducting transparent electrode overlying the SWIR photodiodes is connected to each of the SWIR photodiodes.

6 Claims, 5 Drawing Sheets

MONOLITHIC VISIBLE/IR FUSED LOW LIGHT LEVEL IMAGING SENSOR

BACKGROUND

Silicon-based image sensors provide high sensitivity in the visible portion of the optical spectrum. Improvements in CMOS sensors have provided the basis for low light detection in the visible portion of the spectrum. However, under night viewing conditions, a significant portion of the energy is at wavelengths greater than 1100 nm, which is the longest wavelength that is detectable in a silicon imaging array. Hence, an imaging system that is to operate under nighttime conditions requires a different material system to detect the energy in the near infrared (NIR) portion of the spectrum.

Material systems that can detect NIR photons are known to the art. For example, quantum dot (QD) materials convert NIR photons into electrons that can be collected and measured using CMOS circuitry. QD materials have bandgaps that can be tuned by adjusting the dot size. Such materials have been suggested for use in multi-junction solar cells to improve the efficiency of the cells.

An image sensor that can operate both in the NIR and the visible would be advantageous for forming images both under daylight and nighttime viewing conditions. Since QD based photodetectors rely on different material systems from conventional CMOS imaging detectors, providing such a hybrid imaging sensor presents significant challenges.

SUMMARY

The present invention includes an imaging array and a method for fabricating the same. The imaging array includes a semiconductor substrate having a plurality of visible (VIS) pixel sensors that are sensitive to light in the visual portion of the optical spectrum and a plurality of short wave infrared (SWIR) readout circuits fabricated therein that process light from SWIR photodiodes that are sensitive to light in the short wavelength portion of the infrared spectrum. An insulating layer is deposited on the semiconductor substrate. The insulating array has wells overlying the SWIR readout circuits. A plurality of SWIR photodiodes are deposited in the wells. Each SWIR photodiode is located in a corresponding one of the wells and is connected by an electrically conducting path with the SWIR readout circuit underlying the SWIR photodiode. An electrically conducting transparent electrode overlies the SWIR photodiodes and is connected to each of the SWIR photodiodes.

In one aspect of the invention, the SWIR readout circuits include a capacitive transimpedance amplifier with a feedback capacitor having a capacitance that is controlled by a first bias signal, the first bias signal varying in potential during a readout of one of the SWIR photodiodes connected to the SWIR readout circuit.

In another aspect, the imaging array includes a bias circuit that applies the first bias signal to the SWIR readout circuits and a second bias signal to the electrically conducting transparent electrode.

In another aspect of the invention, a controller sets the first and second bias signals based on the output of the SWIR readout circuits in a previous image.

DETAILED DESCRIPTION

Figure 1:
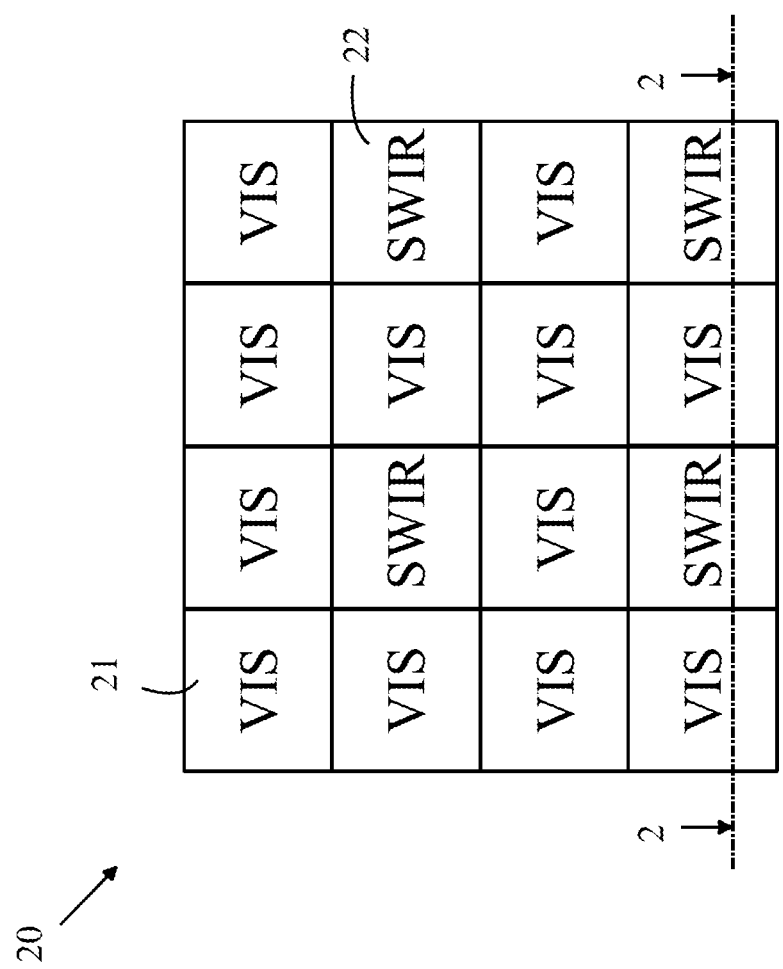
FIG. 1 is a top view of a portion of a hybrid image sensor according to one embodiment of the present invention.

Refer now to FIG. 1, which is a top view of a portion of a hybrid image sensor according to one embodiment of the present invention. HBIS 20 includes a two-dimensional array of pixels organized as a plurality of rows and columns. The VIS pixels include pixels that are sensitive to light in the visual range of the optical spectrum such as pixel 21 and SWIR pixels that are sensitive in the short wavelength region of the optical spectrum such as pixel 22. It should be noted that there are many more rows and columns of pixels than those shown in FIG. 1. To simplify the drawing only a 4×4 sub-array is shown.

For the purposes of the present discussion, a SWIR pixel sensor is defined to be a pixel sensor that converts light having wavelengths between 1.1 µm and 2 µm to an electrical signal that depends on the intensity of that light. A VIS pixel sensor is defined to be a pixel sensor that converts light having wavelengths between 400 nm and 900 nm to an electrical signal that depends on the intensity of that light.

Figure 2:
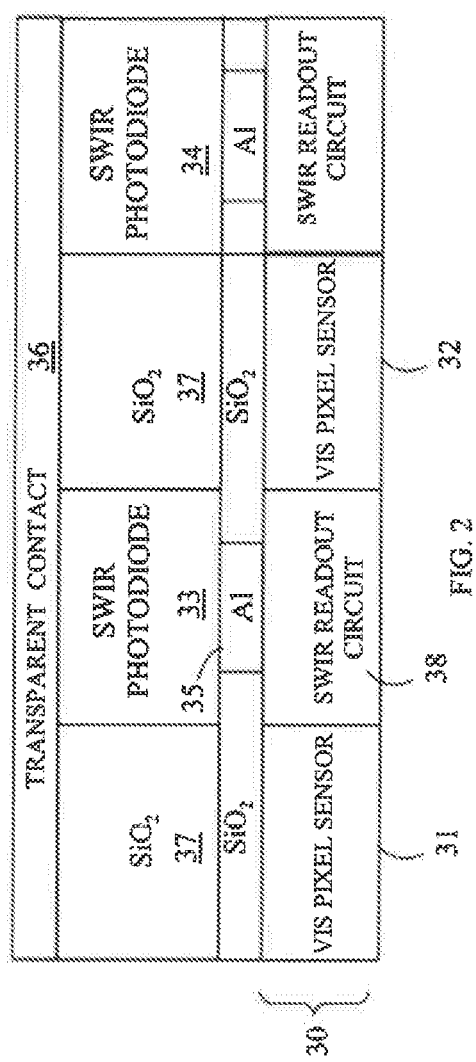
FIG. 2 is a cross-sectional view of a portion of hybrid image sensor (HBIS) 20 through line 2-2 shown in FIG. 1.

Refer now to FIG. 2, which is a cross-sectional view of a portion of HBIS 20 through line 2-2 shown in FIG. 1. HBIS 20 includes a CMOS wafer 30 in which the VIS pixel sensors are fabricated. Exemplary VIS pixel sensors are shown at 31 and 32.

Each SWIR pixel has two components, a SWIR photodiode that converts light to an electrical signal and a SWIR readout circuit that processes the signal from the SWIR photodiode. The SWIR readout circuits are also constructed in CMOS wafer 30. The SWIR photodiodes are deposited on top of CMOS wafer 30 after a patterned layer of $SiO_2$ with conducting pads 35 has been deposited on CMOS wafer 30. Exemplary SWIR photodiodes are shown at 33 and 34. As will be explained in more detail below, each conducting pad provides access to the anode of a corresponding SWIR photodiode. The cathodes of the SWIR photodiodes are accessed by a transparent electrically conducting contact 36 that is preferably constructed from ITO.

The area to be occupied by the SWIR photodiodes is bounded by additional $SiO_2$ deposits to create wells in which the SWIR photodiodes are deposited. A transparent conducting layer such as ITO is deposited over SWIR pixels and the $SiO_2$ regions 37 to provide one of the two contacts needed to power the SWIR photodiodes, the remaining contact being transparent electrically conducting contact 36.

The readout circuitry for the SWIR pixels is divided into two components. The first component shown at 38 is constructed in CMOS wafer 30. There is one such SWIR readout circuit per SWIR photodiode. The other component is shared by all of the SWIR photodiodes that are connected to transparent electrically conducting contact 36.

Figure 3:
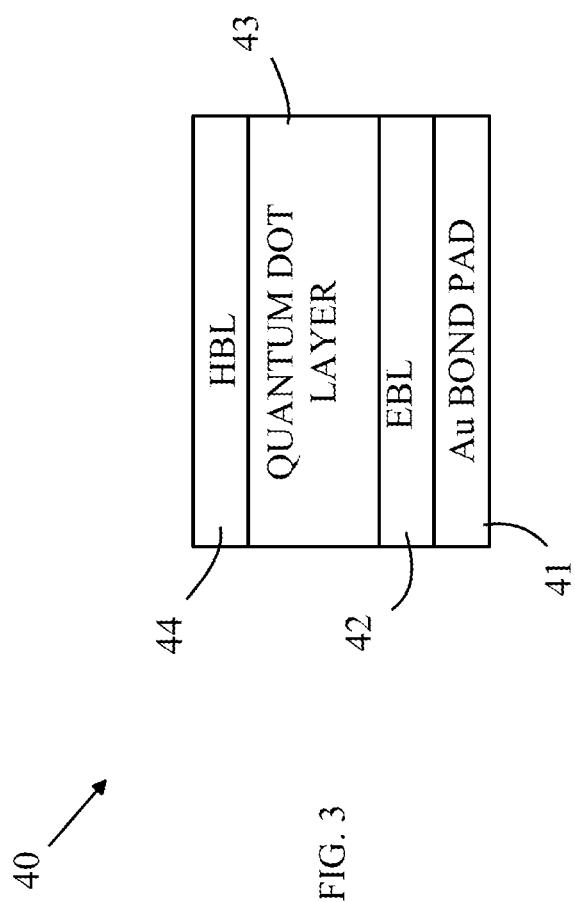
FIG. 3 is a cross-sectional view through one embodiment of the SWIR photodiode according to the present invention.

Refer now to FIG. 3, which is a cross-sectional view through one embodiment of the SWIR photodiode according to the present invention. SWIR photodiode 40 is constructed by successive depositions into a corresponding well whose sides are determined by the $SiO_2$ regions shown at 37 in FIG. 2. Initially, an Au bond pad 41 is deposited over the corresponding Al pad shown in FIG. 2. An electron blocking layer (EBL) 42 is then deposited on Au bond pad 41, followed by a layer 43 of quantum dot material. In one embodiment, PbS quantum dots are used for quantum dot layer 43. Finally, a hole blocking layer (HBL) 44 is deposited over quantum dot layer 43.

Figure 4:
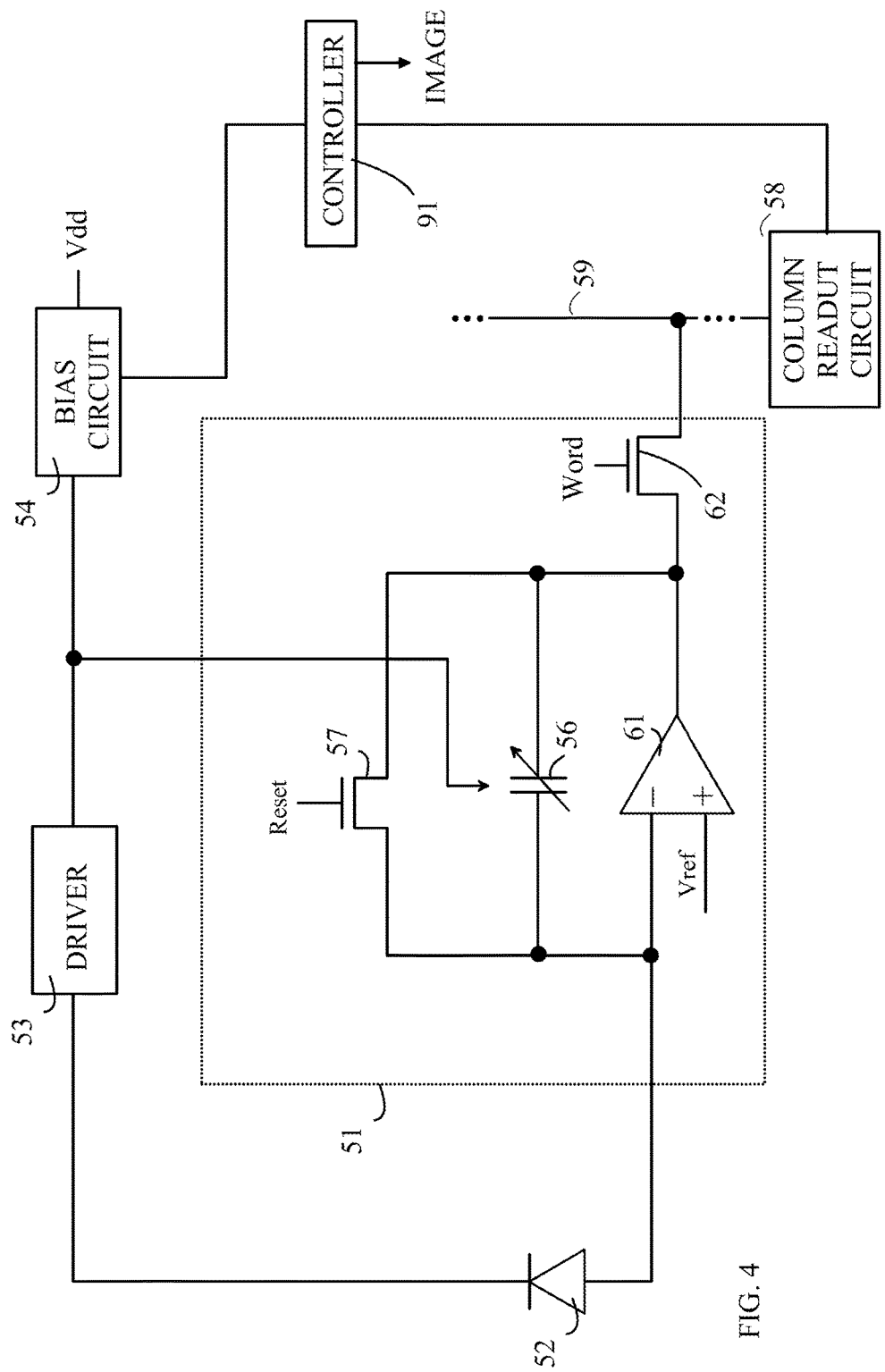
FIG. 4 is a schematic drawing of one embodiment of a SWIR readout circuit according to the present invention.

Refer now to FIG. 4, which is a schematic drawing of one embodiment of a SWIR readout circuit according to the present invention. Readout circuit 51 is connected to the anode of SWIR photodiode 52, which is biased via driver circuit 53. Readout circuit 51 includes a capacitive transimpedance amplifier (CTIA) 61 that has a gain that is set by voltage controlled capacitor 56. Prior to making a measurement, voltage controlled capacitor 56 is shorted via switch 57. The signal from SWIR photodiode 52 is typically prone to noise and dark current problems. By making a number of measurements at different bias levels these problems can be substantially reduced. Bias circuit 54 allows the bias of the SWIR photodiode to be set to a different voltage from the control signal to the voltage controlled capacitor.

The SWIR photodiodes have a parasitic capacitance associated with the diodes. This parasitic capacitance alters the gain of CTIA 61 and alters the overall noise. The output bias voltage from bias circuit 54 is determined by a logic circuit included in controller 91 that analyzes the digitized output from the CTIA and adjusts the bias voltage accordingly. For example, if the original output from CTIA is too low, the logic block will control the bias circuit 54 to generate a higher bias voltage; if the CTIA output is too high, the bias voltage will be reduced.

In one aspect of the invention, the bias voltage will be applied globally to all the SWIR pixels. The control logic in controller 91 makes decisions based on the averaged output from all the CTIAs. The bias voltage is adjusted from frame to frame. If controller 91 determines that the output from the CTIAs are low in the previous frame, the bias voltage is changed before the next frame integration starts.

In one embodiment, the SWIR pixel sensors are arranged in a rectangular array of rows and columns of SWIR pixel sensors. Each SWIR pixel sensor in a given column is connected to a column readout line 59 by a gate 62 that is controlled by a word line that selects all of the SWIR pixel sensors in a given row. The output from the SWIR pixel sensor currently connected to each column readout line is processed by a column readout circuit 58 that optionally includes an analog-to-digital converter that provides a digital value that measures the intensity of light detected by the SWIR pixel sensors in that column.

Figure 5:
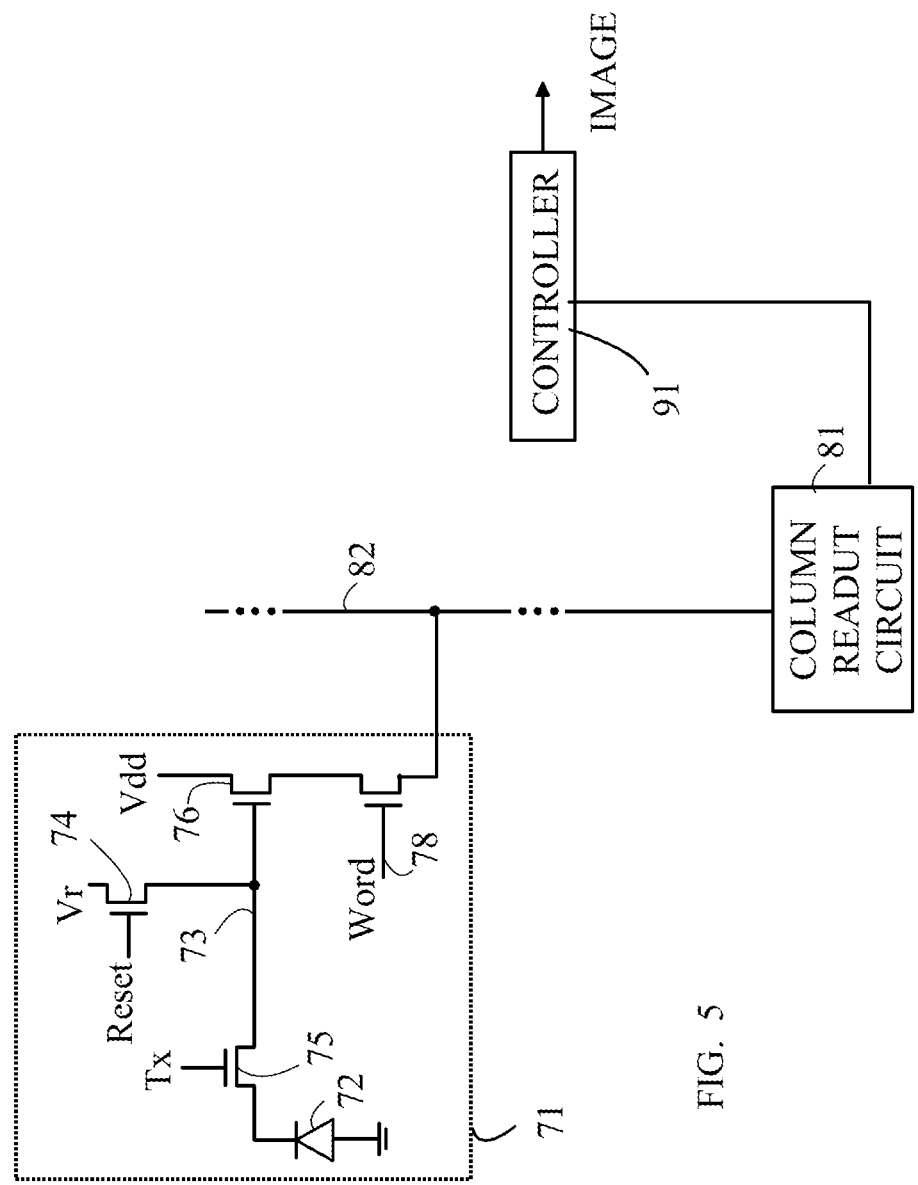
FIG. 5 illustrates an embodiment of a VIS pixel that can be used in the present invention.

Refer now to FIG. 5, which illustrates an embodiment of a VIS pixel that can be used in the present invention. The VIS pixel sensors are organized as a plurality of columns and rows of pixel sensors. During the readout operations, VIS pixel sensors in a selected row are readout in parallel. Each of the VIS pixel sensors in the selected row is connected to a corresponding readout line. In the example shown here, VIS pixel sensor 71 is connected to readout line 82 by applying a word select signal on line 78. At any given time, at most one pixel sensor is connected to readout line 82. The output from column readout circuit 58 is processed by controller 91 to provide the image from the VIS pixels. Controller 91 also operates the word select lines 78 and generates the Reset and Tx signals.

VIS pixel sensor 71 typically includes a photodiode 72 that accumulates charge during the image exposure. At the end of the image exposure, floating diffusion node 73 is reset to Vr by closing gate 74 using a signal on a Reset line. The voltage on floating diffusion node 73 after the reset operation is measured via column readout circuit 81 and stored therein. Source follower 76 provides the power amplification needed to drive readout line 82 and the circuitry connected thereto.

After this voltage measurement, gate 75 is placed in a conducting state in response to a signal on Tx. The positive potential on floating diffusion node 73 causes all of the charge on photodiode 72 to be transferred to floating diffusion node 73. The transferred charge results in a decrease in the potential of floating diffusion node 73 relative to the reset potential. The potential on floating diffusion node 73 is then measured again by column readout circuit 81. The difference in voltage between the two readings is then used to determine the charge that was generated by photodiode 72 during the exposure.

In the above-described embodiments, the SWIR pixel sensors are connected to different column readout lines. However, embodiments in which both types of sensors in a given column are connected to the same column readout line can be constructed. In such common column readout line embodiments, the column readout circuitry must be able to switch between two modes, one for the VIS pixel signals and one for SWIR pixel sensors.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An imaging array comprising:
 a semiconductor substrate having a plurality of VIS pixel sensors and a plurality of SWIR readout circuits fabricated therein;
 an insulating layer deposited on said semiconductor substrate having wells overlying said plurality of SWIR readout circuits;
 a plurality of SWIR photodiodes, each SWIR photodiode being located in a corresponding one of said wells and being connected by an electrically conducting path with said plurality of SWIR readout circuits underlying said plurality of SWIR photodiodes; and
 an electrically conducting transparent electrode overlying said plurality of SWIR photodiodes and being connected to each of said plurality of SWIR photodiodes.

2. The imaging array of claim 1, wherein said SWIR photodiodes comprise a quantum dot material.

3. The imaging array of claim 1, wherein said SWIR readout circuit comprises a capacitive transimpedance amplifier with a feedback capacitor having a capacitance that is controlled by a first bias signal, said first bias signal varying in potential during a readout of one of said SWIR photodiodes connected to said SWIR readout circuit.

4. The imaging array of claim 3, further comprising a bias circuit that applies said first bias signal to said SWIR readout circuits and a second bias signal to said electrically conducting transparent electrode.

5. The imaging array of claim 4, further comprising a controller that sets said first and second bias signals based on an average of outputs of said capacitive transimpedance amplifiers during a previously recorded image.

6. A method of fabricating an imaging array comprising:
 providing a semiconductor substrate having a plurality of VIS pixel sensors and a plurality of SWIR readout circuits fabricated therein;

depositing an insulating layer on said semiconductor substrate, said insulating layer having wells overlying said plurality of SWIR readout circuits;

depositing a plurality of SWIR photodiodes, each of said plurality of SWIR photodiode being located in a corresponding one of said wells and being connected by an electrically conducting path with said STIR readout circuit underlying said SWIR photodiode; and depositing an electrically conducting transparent electrode overlying said plurality of SWIR photodiodes, said electrically conducting transparent electrode being connected to each of said SWIR photodiodes.

\* \* \* \* \*